US008551563B2

(12) United States Patent
Kitano et al.

(10) Patent No.: US 8,551,563 B2
(45) Date of Patent: *Oct. 8, 2013

(54) COATING METHOD (75) Inventors: Takahiro Kitano, Koshi (JP); Koichi Obata, Koshi (JP); Hiroichi Inada, Koshi (JP); Nobuhiro Ogata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/462,880

(22) Filed: May 3, 2012

(65) Prior Publication Data

US 2012/0213925 A1 Aug. 23, 2012

Related U.S. Application Data (62) Division of application No. 12/394,690, filed on Feb. 27, 2009, now Pat. No. 8,225,737.

(30) Foreign Application Priority Data

May 13, 2008 (JP) ................... 2008-126259

(51) Int. Cl.
*B05D 3/12* (2006.01)
(52) U.S. Cl.
USPC ............... 427/240; 427/425; 118/52; 118/56; 118/320; 438/780; 438/782
(58) Field of Classification Search
USPC ................ 427/240, 425; 118/52, 320, 56; 438/780, 782
See application file for complete search history.

(56) References Cited

U.S. PATENT DOCUMENTS

| 5,159,374 | A | 10/1992 | Groshong |
|---|---|---|---|
| 5,689,749 | A | 11/1997 | Tanaka et al. |
| 6,332,723 | B1 | 12/2001 | Matsuyama et al. |
| 6,682,777 | B2 * | 1/2004 | Omori ............................ 427/240 |
| 6,781,684 | B1 | 8/2004 | Ekhoff |
| 7,396,022 | B1 | 7/2008 | Moghadam et al. |

(Continued)

FOREIGN PATENT DOCUMENTS

| JP | 62-62869 U | 4/1987 |
|---|---|---|
| JP | 2-16447 A | 1/1990 |

(Continued)

OTHER PUBLICATIONS

Official Action issued Mar. 6, 2012, in Japanese Patent Application No. 2008-126259, filed May 13, 2008 (w/English Translation).

*Primary Examiner* — Kirsten Jolley
(74) *Attorney, Agent, or Firm* — Oblon, Spivak, McClelland, Maier & Neustadt, L.L.P.

(57) ABSTRACT

A coating method includes holding a substrate in a horizontal state on a substrate holding member; supplying a coating liquid onto a front side central portion of the substrate held on the substrate holding member; rotating the substrate holding member about a vertical axis to spread the coating liquid supplied on the front side central portion of the substrate toward a front side peripheral portion of the substrate by a centrifugal force; and damping a wobble of the substrate being rotated, by a wobble damping mechanism including a gas delivery port and a suction port both disposed to face a back side of the substrate, while delivering a gas from the delivery port and sucking the gas into the suction port.

5 Claims, 8 Drawing Sheets

(56) References Cited

U.S. PATENT DOCUMENTS

| | | |
|---|---|---|
| 7,604,439 B2 | 10/2009 | Yassour et al. |
| 7,648,579 B2 | 1/2010 | Goodman et al. |
| 7,905,195 B2 | 3/2011 | Yamasaki et al. |
| 7,908,995 B2 | 3/2011 | Inamasu et al. |
| 8,057,601 B2 | 11/2011 | Koelmel et al. |
| 2006/0086460 A1* | 4/2006 | Kitamura et al. ........ 156/345.31 |
| 2008/0280054 A1 | 11/2008 | Ogata et al. |
| 2012/0301612 A1 | 11/2012 | Kitano et al. |

FOREIGN PATENT DOCUMENTS

| | | |
|---|---|---|
| JP | 2-164477 | 6/1990 |
| JP | 3-102850 | 4/1991 |
| JP | 6-20935 | 1/1994 |
| JP | 2006-237063 | 9/2006 |
| JP | 2006-261394 | 9/2006 |
| JP | 2007-273541 | 10/2007 |

* cited by examiner

COATING METHOD

CROSS-REFERENCE TO RELATED APPLICATIONS

This application is a divisional of U.S. application Ser. No. 12/394,690, filed Feb. 27, 2009, the entire content of which is incorporated herein by reference, and claims priority under 35 U.S.C. 119 to Japanese Application No. 2008-126259, filed May 13, 2008.

BACKGROUND OF THE INVENTION

1. Field of the Invention

The present invention relates to a coating apparatus and method for forming a coating film on a substrate by a spin coating method.

2. Description of the Related Art

In the process of manufacturing semiconductor devices, there is a step of applying a coating liquid onto a substrate, wherein, for example, a spin coating method is well known as a coating method. The spin coating method is arranged to use a spin chuck as a substrate holding member to attract and hold a substrate, such as a semiconductor wafer (which may be simply referred to as "wafer") or a LCD glass substrate, in a horizontal state. A coating liquid is supplied on the central portion of the substrate while the substrate is rotated at a high speed, so that the coating liquid is spread by a centrifugal force to form a film. A representative example of the coating liquid used in this step is a resist liquid, which has been prepared by dissolving a resist component in a solvent. When the resist liquid is spread on the front side of the substrate by spin coating, the solvent contained in the resist liquid is evaporated, and so the resist liquid is dried and a resist film is thereby formed. The height at which the solvent is evaporated, specifically the height at which thick solvent vapor generated by evaporation of the solvent is present, is called a boundary layer. Where the thickness (height) of the boundary layer is stabilized, the solvent can be evaporated uniformly on the plane of the substrate, and so the planar uniformity of the thickness of the coating film is improved. The boundary layer varies depending on the substrate rotational speed, gas flows generated by the substrate rotation, the gas density, and so forth.

Figure 9A:
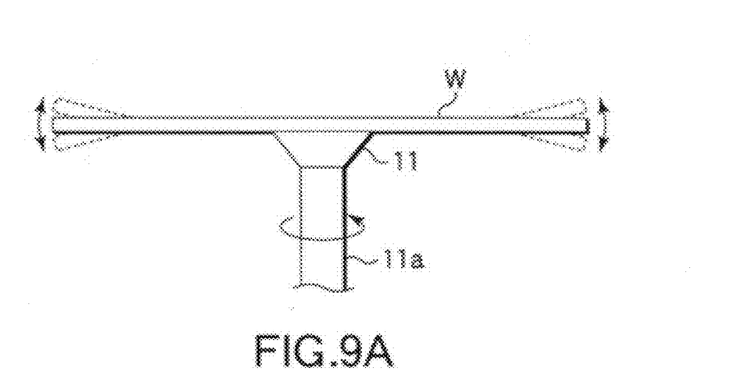
FIGS. 9A and 9B are schematic views for explaining a manner of rotating a wafer according to a conventional technique.
Figure 9B:
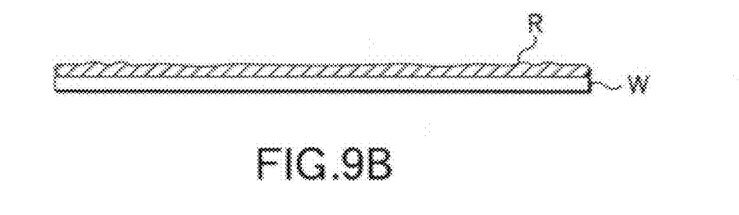

Incidentally, in recent years, demands on the coating step have been technically advanced, such as a smaller thickness of coating films and an improved planar uniformity of the film thickness. In order to address the demands described above, the spin coating method may be arranged to use a higher speed in rotating a substrate. However, if the rotational speed is increased, gas flows are more disturbed on the peripheral portion of the substrate, because the substrate is not necessarily rotated in a horizontal state, but generates a vibration (wobble) to some extent particularly at the peripheral portion, as shown in FIG. 9A. Accordingly, the thickness of the boundary layer varies with time at wobbled portions, and so the solvent is evaporated less uniformly on the plane of the substrate. Consequently, a predetermined film thickness profile can be hardly attained, such that the thickness of the coating film on the substrate becomes locally smaller on the peripheral portion (see FIG. 9B), for example. Further, the film thickness profile is problematically fluctuated among substrates. In recent years, the size of semiconductor wafers has been increasingly larger, wherein an increase in the size of a wafer amplifies the wobble of the wafer being rotated and makes the problem described above more prominent.

It is thought that a vibration of a substrate being rotated is generated by the following factors. Specifically, the face of a spin chuck for holding a substrate is not necessarily horizontal but may include some deformation. Particles are present between the spin chuck and substrate and hinder the substrate from being held in an ideally horizontal state. A substrate has been not necessarily prepared as a flat circular plate in its manufacturing process, and it may have been deformed for some reason.

On the other hand, Jpn. Pat. Appln. KOKAI Publication No. 2-164477 (FIG. 1) discloses a coating apparatus arranged such that gas flows are formed between the substrate and substrate holding member and the substrate is held by the substrate holding member in a non-contact state, so that particles deposited on the holding member are prevented from being transferred onto the substrate, and the posture of the substrate being rotated can be adjusted into a horizontal state. However, where the substrate is held and rotated in a non-contact state, the rotational power of a driving unit cannot be directly transmitted to the substrate and so the substrate rotational speed may be adversely affected. Accordingly, this structure is unlikely to meet the demands described above. Further, where a deformed substrate is rotated, a vibration occurs and disturbs gas flows on the front side of the substrate, and so the thickness of the boundary layer becomes less uniform and the solvent is evaporated less uniformly. Consequently, the film thickness can be hardly constant.

BRIEF SUMMARY OF THE INVENTION

An object of the present invention is to provide a coating apparatus and method that can stabilize the film thickness profile of a coating film in forming the coating film on a substrate by a spin coating method.

According to a first aspect of the present invention, there is provided a coating apparatus comprising: a substrate holding member configured to hold a substrate in a horizontal state; a coating liquid supply mechanism configured to supply a coating liquid onto a front side central portion of the substrate held on the substrate holding member; a driving unit configured to rotate the substrate holding member about a vertical axis to spread the coating liquid supplied on the front side central portion of the substrate toward a front side peripheral portion of the substrate by a centrifugal force; and a wobble damping mechanism including a gas delivery port and a suction port both disposed to face a back side of the substrate and configured to damp a wobble of the substrate being rotated by delivering a gas from the delivery port and sucking the gas into the suction port.

The coating apparatus may further comprise an elevating mechanism configured to move up and down the wobble damping mechanism between a working position for damping the wobble of the substrate and a waiting position below the working position. In this case, the coating apparatus may further comprise a control section configured to control an operation of the coating apparatus and preset to set the wobble damping mechanism at the waiting position when the substrate is transferred to the substrate holding member. The coating apparatus may further comprise a control section configured to control an operation of the coating apparatus and preset to move up the wobble damping mechanism from the waiting position to the working position to be closer to the substrate held on the substrate holding member, while delivering the gas from the gas delivery port and not sucking the gas into the suction port.

The coating apparatus may further comprise a lifter mechanism configured to move up and down the substrate between a process position for applying the coating liquid and a transfer position for transferring the substrate to and from an external transfer member. The coating apparatus may further comprise a control section configured to control an operation of the coating apparatus and preset to set the wobble damping mechanism at the waiting position when moving down the substrate from the transfer position to the process position.

The wobble damping mechanism may have an annular shape extending in a rotational direction of the substrate. In this case, the wobble damping mechanism may include an annular casing extending in a rotational direction of the substrate, and the gas delivery port and the suction port is formed on the upper surface of the casing. The gas delivery port may comprise a plurality of delivery holes arrayed in an annular direction and the suction port may comprise a plurality of suction holes arrayed in an annular direction. The delivery holes and the suction holes may be alternately arrayed in annular directions and radial directions.

According to a second aspect of the present invention, there is provided a coating method comprising: holding a substrate in a horizontal state on a substrate holding member; supplying a coating liquid onto a front side central portion of the substrate held on the substrate holding member; rotating the substrate holding member about a vertical axis to spread the coating liquid supplied on the front side central portion of the substrate toward a front side peripheral portion of the substrate by a centrifugal force; and damping a wobble of the substrate being rotated, by a wobble damping mechanism including a gas delivery port and a suction port both disposed to face a back side of the substrate, while delivering a gas from the delivery port and sucking the gas into the suction port.

In the coating method, said damping a wobble of the substrate being rotated may be performed at least in a period for leveling the coating film to have a uniform film thickness. The method may further comprise moving up and down the wobble damping mechanism between a working position for damping the wobble of the substrate and a waiting position below the working position. In this case, the wobble damping mechanism may be set at the waiting position when the substrate is transferred to the substrate holding member. The method may comprise moving up the wobble damping mechanism from the waiting position to the working position to be closer to the substrate held on the substrate holding member, while delivering the gas from the gas delivery port and not sucking the gas into the suction port. The wobble damping mechanism may have an annular shape extending in a rotational direction of the substrate.

According to a third aspect of the present invention, there is provided a computer readable medium containing program instructions for execution on a processor for performing the coating method according to the second aspect, wherein the program instructions, when executed by the processor, cause a coating apparatus for applying a coating liquid onto a substrate being rotated to perform the coating method according to the second aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will now be described in detail with reference to the accompanying drawings.

Figure 1:
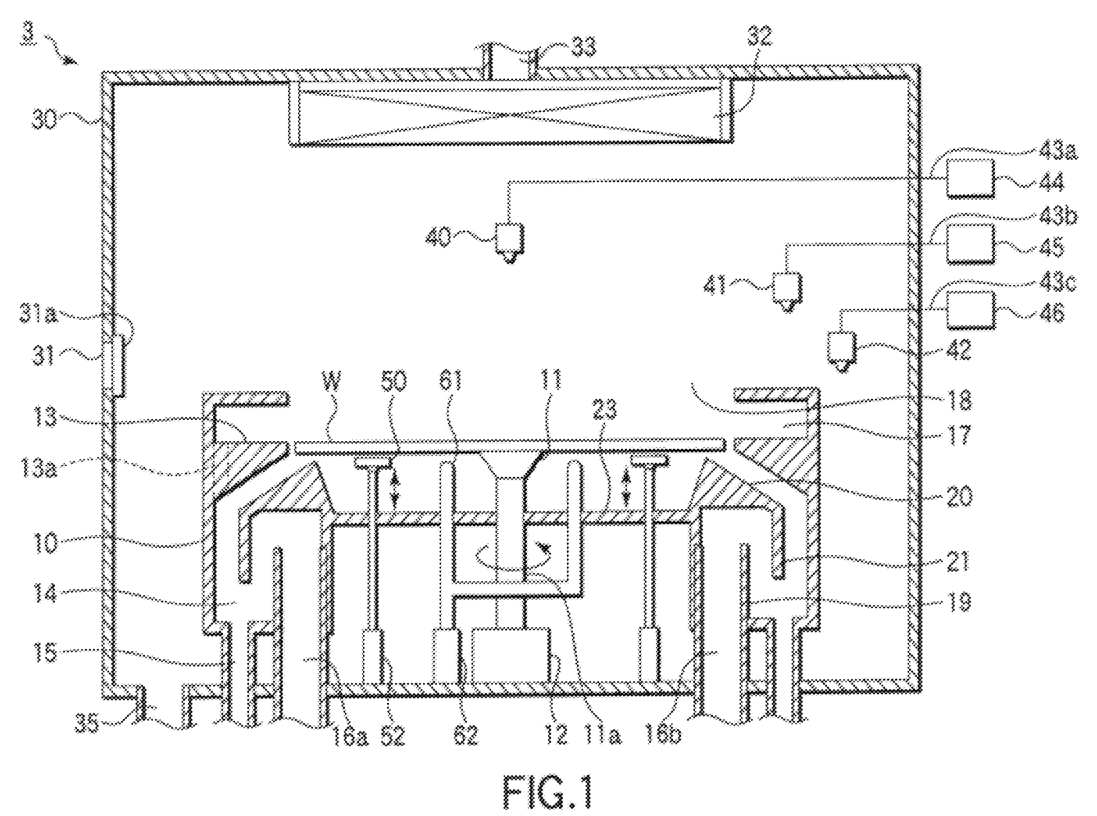
FIG. 1 is a sectional side view showing a coating apparatus according to an embodiment of the present invention.

FIG. 1 is a sectional side view showing a coating apparatus 3 according to an embodiment of the present invention. The coating apparatus 3 includes a spin chuck 11 serving as a substrate holding member configured to attract and hold by vacuum a substrate or wafer W in essentially a horizontal state, and a cup 10 disposed to surround the spin chuck 11. The spin chuck 11 is movable up and down and rotatable about a vertical axis through a shaft 11a by a driving unit 12 disposed on a lower side. The cup 10 has a circular opening 18 slightly larger than the wafer W at the top to allow the wafer W to be transferred therethrough. An annular recessed portion 17 is formed around the opening 18 such that the rim of the annular recessed portion 17 is carved out horizontally outward. The bottom surface 13 of this recessed portion serves to regulate gas flows generated by the wafer W being rotated, so that the resist film thickness on the peripheral portion of the wafer becomes more uniform.

The cup 10 includes a liquid receiving portion 14 formed as a recessed portion at the bottom to be located outside the peripheral portion of the wafer W. The liquid receiving portion 14 is connected to a drain passage 15 for discharging drainage outside. Further, communicating passages 13a are formed vertically downward from the outer end of the bottom surface 13 to the liquid receiving portion 14. Further, exhaust pipes 16a and 16b extend from below to positions inside the cup 10 inwardly adjacent to the liquid receiving portion 14 each with a rising wall portion 19 interposed therebetween, which serves to separate gas and liquid from each other inside the cup 10. The two exhaust pipes 16a and 16b are merged at a downstream position and connected to an exhaust duct in the factory.

The cup 10 includes a annular guide member 20 having a convex shape in the cross section and disposed to be in proximity to the back side peripheral portion of the wafer W held on the spin chuck 11. The guide member 20 serves to prevent a resist liquid from flowing onto the back side of the wafer W. The guide member 20 includes a vertical wall 21 extending vertically downward from the outer end into the liquid receiving portion 14. The lower end of the vertical wall 21 is present below the upper ends of the exhaust pipes 16a and 16b. Accordingly, a resist liquid thrown off from the wafer W being rotated is guided by the surface of the guide member 20 and vertical wall 21 into the liquid receiving portion 14 and temporarily stored in the liquid receiving portion 14, and then the resist liquid flows through the drain passage 15 outside the cup 10. Further, the guide member 20 is continuously connected to a partition plate 23 on the inner side, which is horizontally set at the central portion of the cup 10. The partition plate 23 is configured to form a space near the back side of the wafer W, which is partitioned from an outer space on the lower side of the cup 10.

Figure 2A:
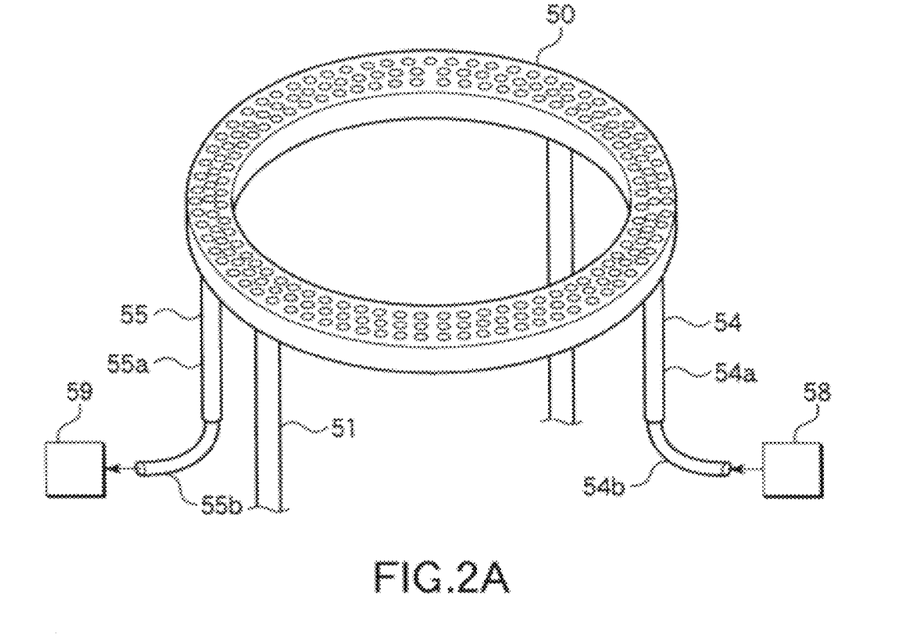
FIGS. 2A and 2B are views for explaining the structure of a wobble damping mechanism according to the embodiment of the present invention.
Figure 3:
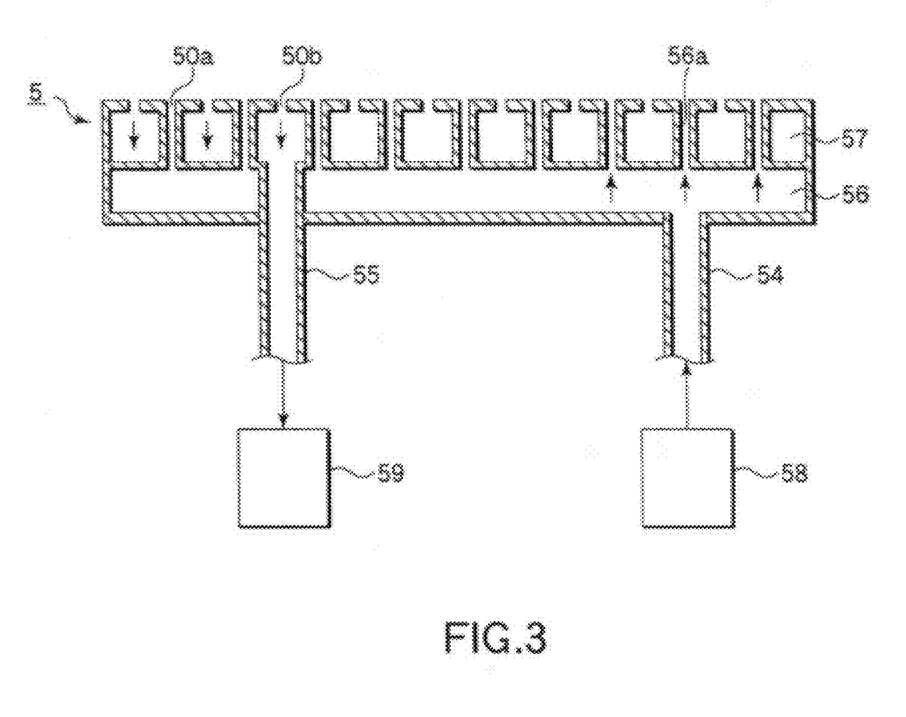
FIG. 3 is a sectional side view of the wobble damping mechanism.

As shown in FIGS. 1 and 2A, a wobble damping mechanism 50 is disposed on an inner side of the guide member 20 to be present at a position distant from the outer edge of the wafer W to some extent and to partly cover the back side of the wafer W. As shown in FIGS. 2A and 3, the wobble damping mechanism 50 includes an annular flat casing 5, which is divided into lower and upper spaces serving as a supply chamber 56 and a suction chamber 57, respectively. The supply chamber 56 is connected to straight pipes 56a extending through the suction chamber 57 to the upper surface of the casing 5. The upper ends of the straight pipes 56a are formed as delivery holes 50a serving as a gas delivery port. The suction chamber 57 has suction holes 50b formed in the upper side (the upper surface of the casing 5) and serving as a gas suction port.

Figure 2B:
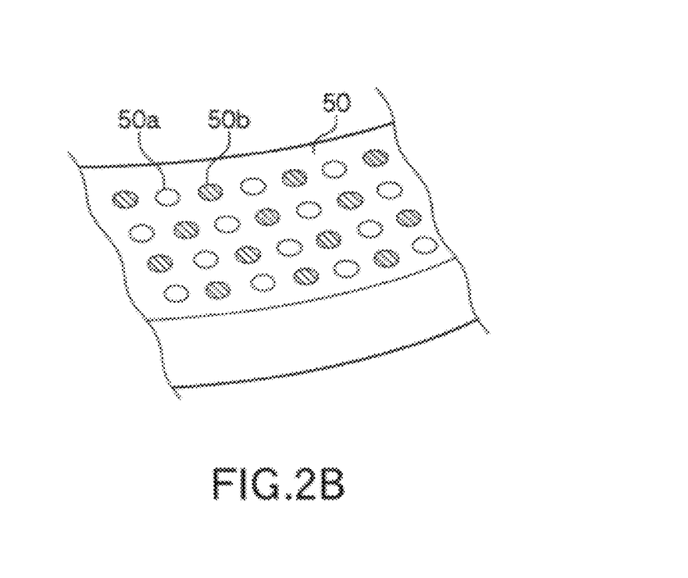

The diameter of the holes 50a and 50b is set at, e.g., about 200 μm. As shown in FIG. 2B, the gas delivery holes 50a and suction holes 50b are arrayed on the casing 5 in, e.g., four rows concentrically arranged about the rotational axis of the spin chuck 11. Each set of the delivery holes 50a and suction holes 50b forms a staggered pattern, and the holes 50a and 50b are alternately arrayed. The supply chamber 56 and suction chamber 57 are respectively connected to a gas supply line 54 and a suction line 55. The distal ends of the gas supply line 54 and suction line 55 are respectively connected to a gas supply unit 58 and a gas suction unit 59. A gas is supplied by the gas supply unit 58 through the gas supply line 54 and supply chamber 56, and is delivered from the delivery holes 50a into a space above the casing 5. Further, the gas in the space above the casing 5 is sucked by the gas suction unit 59 from the suction holes 50b through the suction chamber 57 and suction line 55. For example, the gas supply line 54 and suction line 55 are formed of metal tubes 54a and 55a that penetrate the partition plate 23 and flexible resin tubes 54b and 55b connected to the lower sides of the metal tubes 54a and 55a, respectively. Further, the wobble damping mechanism 50 is movable up and down by an elevating mechanism 52 through elevating shafts 51.

Three lifter pins 61 are disposed between the wobble damping mechanism 50 and the center of the cup 10 and are configured to be moved up and down through the partition plate 23 by a vertically driving unit 62. The lifter pins 61 can support the back side of the wafer W and serve to transfer the wafer W between an external transfer arm and the spin chuck 11.

The cup 10 is housed in a casing 30 having a transfer port 31 for the wafer W, which is formed in the sidewall and provided with a shutter 31a for opening/closing the transfer port 31. The wafer W is loaded and unloaded through the transfer port 31 by the external transfer arm (not shown). Further, the casing 30 is provided with a fan/filter unit (FFU) 32 at the top, which receives a clean gas flowing through a gas supply passage 33 and supplies the clean gas as down flows into the casing 30. Further, the casing 30 is connected to a suction exhaust passage 35 at the bottom to exhaust gas outside from inside the casing 30. Accordingly, gas flows are formed downward inside the cup 10 by down flows from the FFU 32 in cooperation with the suction effect provided by the exhaust pipes 16a and 16b described above.

A coating nozzle 40, a solvent nozzle 41, and a rinsing nozzle 42 are disposed above the cup 10 inside the casing 30, and are configured to respectively supply a resist liquid, a solvent, and a rinsing liquid onto the wafer W. Further, the nozzles 40, 41, and 42 are connected through supply lines 43a, 43b, and 43c to a coating liquid supply source 44, a solvent supply source 45, and a rinsing liquid supply source 46, respectively. Further, each of the nozzles 40, 41, and 42 is configured to be moved by a traveling arm (not shown) between a predetermined position above the wafer W and a nozzle waiting position laterally separated from the cup 10.

Figure 4:
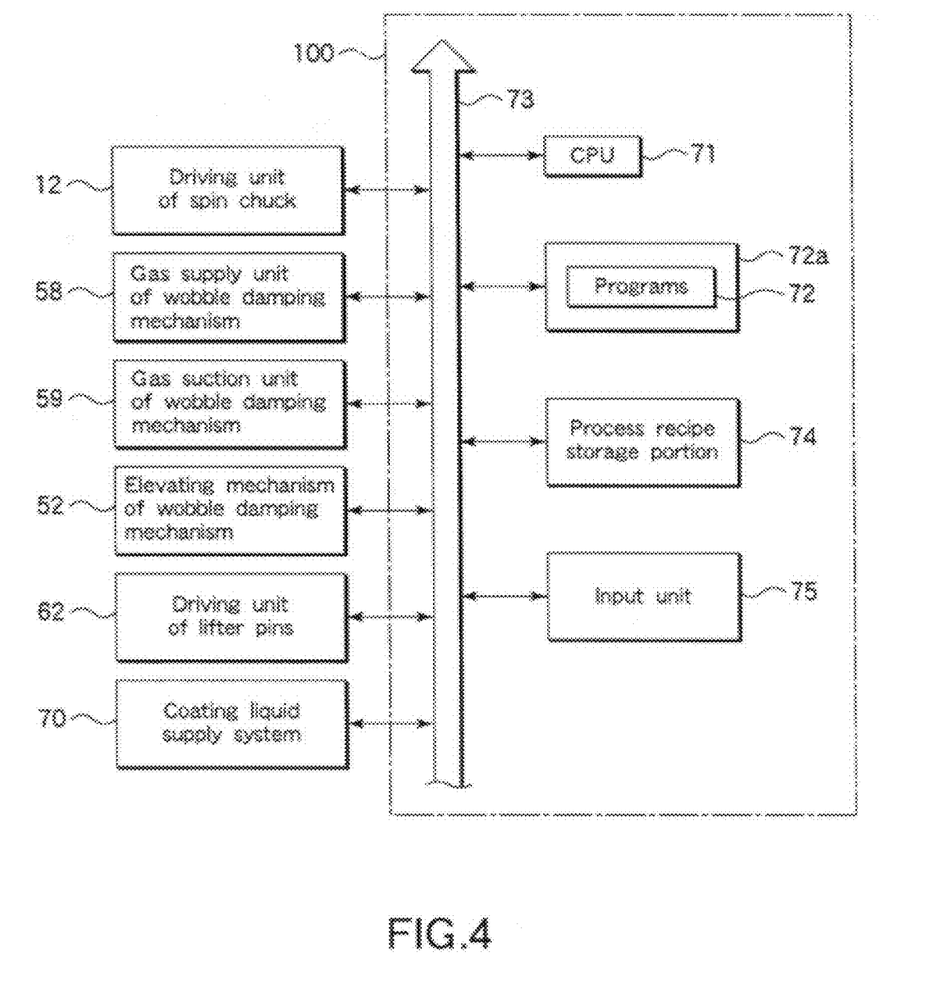
FIG. 4 is a view for explaining the structure of a control section.
Figure 5:
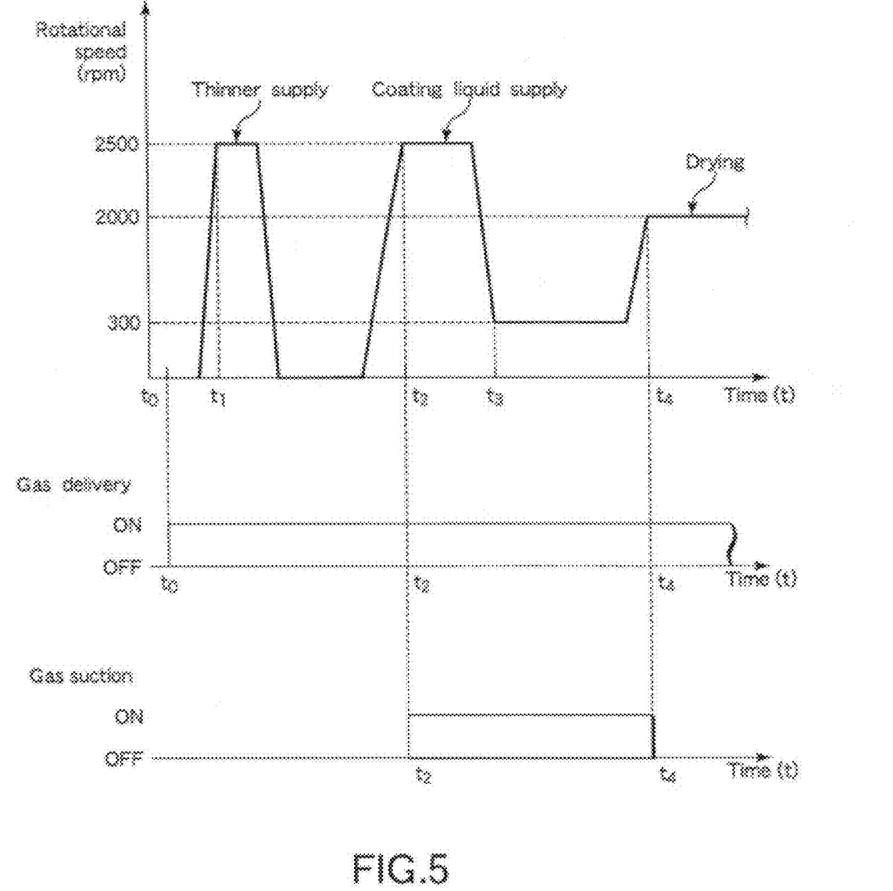
FIG. 5 is an example of a time chart showing the wafer rotational speed and an operation of the wobble damping mechanism according to the embodiment of the present invention.

The coating apparatus 3 includes a control section 100, which has a structure shown in FIG. 4. The control section 100 comprises a computer formed of a CPU 71, a program storage portion 72a, a data bus 73, a process recipe storage portion 74, an input unit 75, and so forth. The program storage portion 72a stores programs 72 each for executing a series of operations for a coating process. The control section 100 is connected to the driving unit 12 of the spin chuck, the gas supply unit 58 and gas suction unit 59 of the wobble damping mechanism, the vertically driving unit 52 of the wobble damping mechanism, the vertically driving unit 62 of the lifter pins, the coating liquid supply system 70, and so forth. The control section 100 outputs control signals to these portions. The coating liquid supply system 70 includes valves and a pump configured to supply a coating liquid onto the wafer W and to adjust the supply, stop, and amount of the coating liquid to be applied. The programs 72 are installed into the control section 100 by use of a storage medium, such as a flexible disk, hard disk, MD, memory card, or compact disk.

Figure 6A:
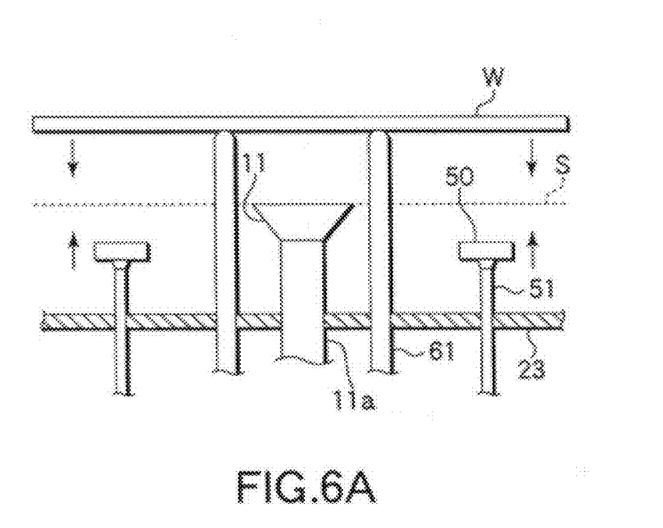
FIGS. 6A and 6B are schematic views for explaining an operation of the wobble damping mechanism when a wafer is placed on a spin chuck.

Next, an explanation will be given of an operation according to the embodiment described above. At first, as a time point t0, a wafer W is transferred by an external transfer arm (not shown) through the transfer port 31 into the casing 30 and is position above the cup 10. Then, the lifter pins 61 are moved up and thereby lift the wafer W from the transfer arm, and then the transfer arm is retreated, so that the wafer W is transferred from the transfer arm onto the lifter pins 61. Then, the lifter pins 61 are moved down and thereby place the wafer W onto the spin chuck 11, and then the wafer W is attracted and held by the spin chuck 11. At this time, the wobble damping mechanism 50 is set at a position (waiting position) several tens millimeters distant downward from, e.g., the wafer support face of the spin chuck 50 (FIG. 6A). When a coating process is performed on the wafer W, the wobble damping mechanism 50 is set at a position (working position) in height very close to the wafer W. However, when the wafer W is placed onto the spin chuck 11, the wobble damping mechanism 50 is set at the lower position to prevent the wafer W from coming into contact with the wobble damping mechanism 50, because the collision between them may happen if the wafer W is warped, for example.

In this embodiment, the position of the wafer W lifted by the lifter pins 61 corresponds to a transfer position, and the position of the wafer W on the spin chuck 11 corresponds to a process position for performing the coating process. In FIG.

6A, the back side level of the wafer W at the process position is used as a reference level S. In this embodiment, the wafer W is transferred between the lifter pins 61 and external transfer arm, but the wafer W may be transferred by use of a vertical movement of the spin chuck 11 in place of use of the lifter pins 61.

Figure 6B:
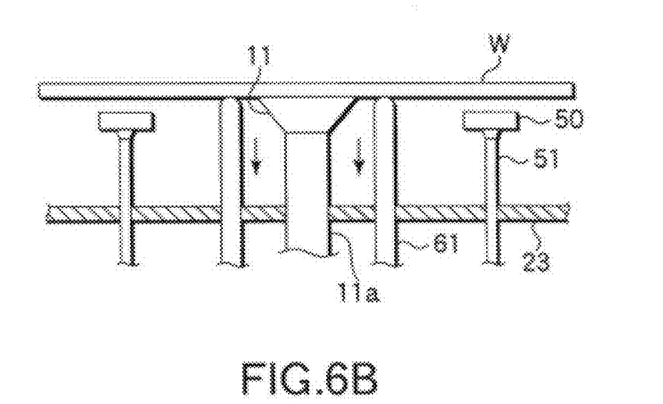

After the wafer W is attracted and held on the spin chuck 11, the wobble damping mechanism 50 is moved up while a gas, such as air, is delivered from the delivery holes 50a (FIG. 6B). Then, the wobble damping mechanism 50 is set at a position (working position) close to the wafer W but about 50 μm to several hundreds μm distant from the wafer W. When the wobble damping mechanism 50 is moved toward the wafer W, a gas is delivered from the delivery holes 50a, so that, even if the wafer W is warped, the posture of the wafer W is corrected by the gas pressure to prevent collision between them. In this respect, if the wobble damping mechanism 50 is set at the higher position, and the wafer W is moved down while a gas is delivered from the delivery holes 50a, the wafer W on the lifter pins 61 may unfavorably cause a positional shift due to the gas pressure.

Then, the wafer W is rotated at a speed of, e.g., 2,500 rpm by the driving unit 12 through the spin chuck 11. Around the wafer W, gas flows are supplied downward from the FFU 32 on the upper side, while gas is exhausted by the suction force applied inside the cup 10. Consequently, gas flows are formed such that they are supplied from above toward the front side of the wafer W and are then drawn downward from the outer edge of the wafer W. These downward gas flows are spread in a spiral pattern by a centrifugal force, which is generated by the wafer W being rotated, toward the peripheral portion of the wafer W, and are then thrown off outward. Then, the solvent nozzle 41 is moved by a traveling arm (not shown) from the waiting position to a position above the central portion of the wafer W, and the solvent for so-called pre-wetting is supplied to improve the wettability of the front side of the wafer W from a time point t1. Then, the rotation of the wafer W is temporarily stopped, and the solvent nozzle 41 is retreated and the coating nozzle 40 is moved to a position above the central portion of the wafer W.

Figure 7A:
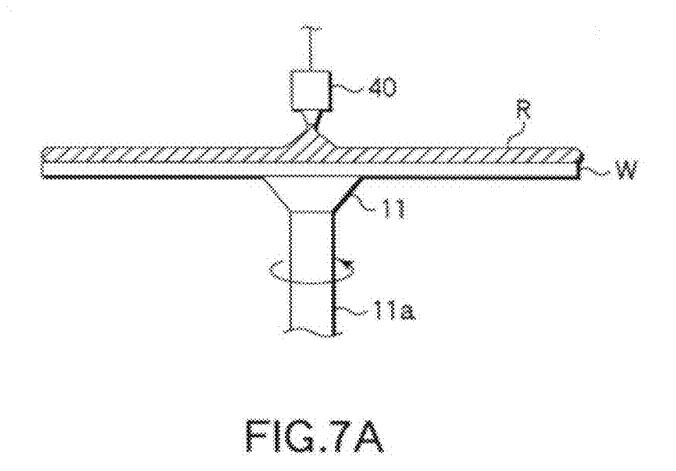
FIGS. 7A and 7B are schematic views for explaining a manner of applying a resist liquid onto a wafer.

Then, while the wafer W is rotated at a higher rotational speed of, e.g., 2,500 rpm, the resist liquid R is applied from the coating nozzle 40 onto the front side of the wafer W from a time point t2. At this time, as shown in the coating manner of FIG. 7A, the resist liquid R is spread toward the peripheral portion by a centrifugal force generated by the wafer W being rotated. Further, superfluous part of the resist liquid R is thrown off outward by the centrifugal force, then flows through the communicating passages 13a and the surface of the guide member 20, and is then discharged outside from the cup 10 through the liquid receiving portion 14 and drain passage 15.

Figure 7B:
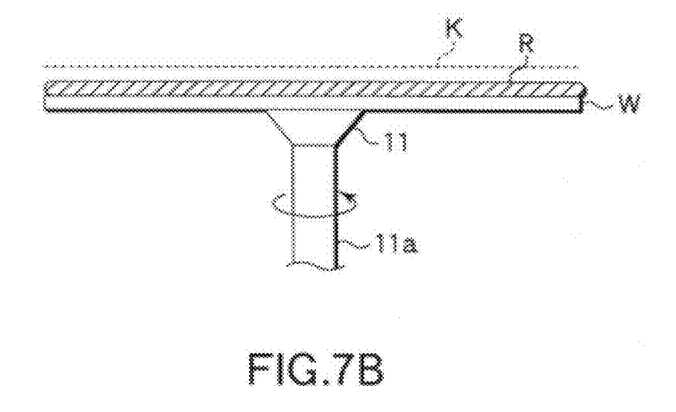
Figure 8A:
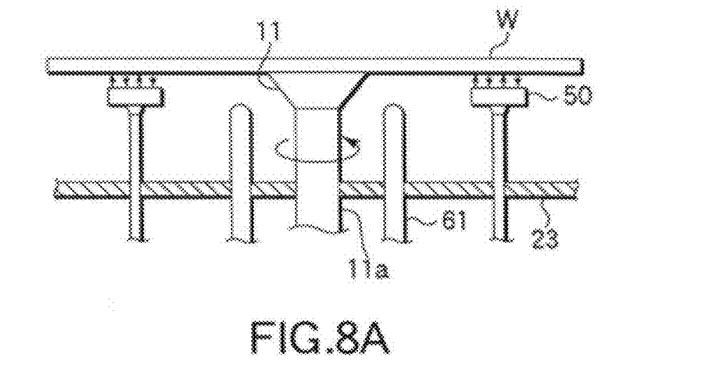
FIGS. 8A and 8B are schematic views for explaining a manner of rotating a wafer according to the present invention.
Figure 8B:
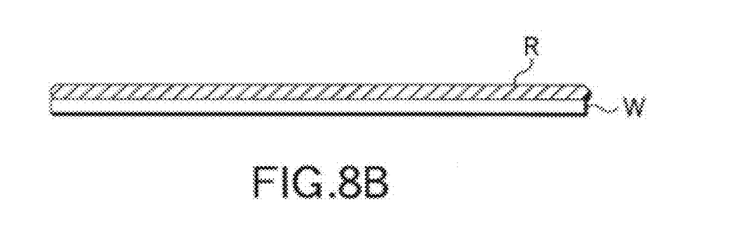

Thereafter, from the time point t3, the wafer W is rotated at a lower rotational speed of, e.g., 300 rpm, so that the thickness of the resist liquid R becomes more smooth or uniform, as shown in FIG. 7B (leveling step). At this time, when the thickness of the resist liquid is uniform, as shown in FIG. 7B, the thickness of the boundary layer K becomes constant, and so the solvent contained in the resist liquid R can be evaporated uniformly over the front side of the wafer. Further, simultaneously with this leveling step being performed, the rinsing liquid is supplied from the rinsing nozzle 42 onto the peripheral portion of the wafer W, so that superfluous part of the resist liquid is cut and removed by a predetermined width. Then, from a time point t4, the wafer W is rotated at a higher rotational speed of, e.g., 2,000 rpm for a predetermined time, so that the solvent in the coating film of the resist liquid R is evaporated (drying step). Then, the rotation of the wafer W is stopped, and the wafer W is transferred onto the transfer arm and unloaded from inside the cup 10 in a sequence reverse to that for the loading of the wafer W, On the other hand, after the wobble damping mechanism 50 is set at a position (working position) slightly lower than the back side of the wafer W as described above, a gas is delivered from the delivery holes 50a while the gas is sucked into the suction holes 50b. Accordingly, gas flows are generated due to the both actions of gas delivery and suction, as shown in FIG. 8A, in the gap between the upper face of the annular casing 5 of the wobble damping mechanism 50 and the wafer W, and so a sort of air buffer layer is present below the wafer W. As described previously with reference to FIGS. 9A and 9B, when a wafer W is rotated at a high speed, the peripheral portion tends to generate a vertical wobble. However, in this embodiment, the air buffer layer is formed with a good balance between the gas delivery and suction and the peripheral portion of the wafer W is in close contact with the buffer layer, so that the wobble of the peripheral portion is damped. In other words, the wafer W is kept in a horizontal posture state by the wobble damping mechanism 50 without contact with the wobble damping mechanism 50.

When the wafer W is rotated, gas flows are generated in a spiral pattern from the central portion toward the outside on the front side of the wafer W. Since the peripheral portion is prevented from causing a wobble, the gas flows are not disturbed, and so the height of a layer of thick solvent vapor (boundary layer) generated by evaporation of the solvent near the surface becomes constant. Further, in the coating film drying step from the time point t4, since the wobble of the wafer W does not need to be damped, the wobble damping mechanism 50 may be set at the lower position (waiting position). However, in this step, the wobble damping mechanism 50 may be kept at the higher position along only with the gas delivery being performed or along with the gas delivery and suction being kept performed. In other words, the effect of damping the wobble or vibration is preset to be used at least in a step (time period) when the wobble of the peripheral portion of the wafer W affects the film thickness profile.

Where the wobble damping mechanism 50 is set at the position (working position) near the wafer W until the rotation of the wafer W is stopped, the gas delivery from the wobble damping mechanism 50 is preferably performed at least when the rotational speed is decreased to prevent the wafer W from colliding with wobble damping mechanism 50. Further, when the wafer W is moved up from the spin chuck 11 by the lifter pins 61 and is unladed, the wobble damping mechanism 50 preferably has been moved down or the gas delivery and suction of the wobble damping mechanism 50 preferably have been stopped.

<Experiment>

A distance meter using a laser beam was disposed to face the peripheral portion of a wafer W from above and used to measure the wobble of the wafer W while the wafer W was rotated at 2,000 rpm. This measurement was performed in both of cases where the damping mechanism 50 was used to damp the wobble as described above and where the damping mechanism 50 was not used to damp the wobble. Based on the distance data thus obtained, the wobble amount of the peripheral portion of the wafer W, i.e., the fluctuation in the distance, was calculated. As a result, where the wobble damping mechanism 50 was used, the wobble amount was 5 μm. Where the wobble damping mechanism 50 was not used, the wobble amount was a little less than 100 μm. Accordingly, it has been confirmed that the wobble damping mechanism 50 is effective to damp the wobble of the peripheral portion of the wafer W.

According to the embodiment described above, the wobble damping mechanism 50 is disposed to face the back side peripheral portion of the wafer W in the vicinity thereof. The wobble damping mechanism 50 is used to supply a gas therefrom and to suck the gas therein when the wafer W is rotated, such that gas flows are formed between the wafer W and wobble damping mechanism 50, and the wobble of the peripheral portion of the wafer W is thereby damped. Accordingly, when the wafer W is rotated, the front side of the wafer W less suffers disturbance of gas flows, so that the height (thickness) of a boundary layer, which is a layer of thick solvent vapor, is prevented from being fluctuated. Consequently, the film thickness profile of a coating film is formed more reliably in accordance with a predetermined film thickness profile, whereby the planar uniformity of the film thickness on the wafer W is improved, and the inter-substrate uniformity of the film thickness is also improved. In this case, since the film thickness profile is stabilized, the yield can be improved.

In the embodiment described above, the wobble damping mechanism 50 has an annular shape extending all around the rotational direction of the wafer W (i.e., all over an annular direction). Alternatively, the wobble damping mechanism may be formed of a plurality of portions arrayed at intervals in the rotational direction. Further, in the embodiment described above, the coating liquid is exemplified by a resist liquid. Alternatively, the coating liquid may be a coating liquid for an insulating film, which is prepared by dissolving a precursor of, e.g., silicon oxide in a solvent.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A coating method comprising:
holding a substrate in a horizontal state on a substrate holding member;
supplying a coating liquid onto a front side central portion of the substrate held on the substrate holding member;
rotating the substrate holding member about a vertical axis to spread the coating liquid supplied on the front side central portion of the substrate toward a front side peripheral portion of the substrate by a centrifugal force; and
damping a wobble of the substrate being rotated, by a wobble damping mechanism including a gas delivery port and a suction port both disposed to face a back side of the substrate, while delivering a gas from the delivery port and sucking the gas into the suction port,
wherein the method further comprises moving up and down the wobble damping mechanism between a working position for damping the wobble of the substrate and a waiting position below the working position.

2. The coating method according to claim 1, wherein said damping a wobble of the substrate being rotated is performed at least in a period for leveling the coating film to have a uniform film thickness.

3. The coating method according to claim 1, wherein the wobble damping mechanism is set at the waiting position when the substrate is transferred to the substrate holding member.

4. The coating method according to claim 1, wherein the method comprises moving up the wobble damping mechanism from the waiting position to the working position to be closer to the substrate held on the substrate holding member, while delivering the gas from the gas delivery port and not sucking the gas into the suction port.

5. The coating method according to claim 1, wherein the wobble damping mechanism has an annular shape extending in a rotational direction of the substrate.

* * * * *